United States Patent
Einthoven

[19]

[11] Patent Number: 5,773,874
[45] Date of Patent: Jun. 30, 1998

[54] SEMICONDUCTOR DEVICE HAVING A MESA STRUCTURE FOR SURFACE VOLTAGE BREAKDOWN

[75] Inventor: Willem Gerard Einthoven, Belle Mead, N.J.

[73] Assignee: General Instrument Corporation, Hatboro, Pa.

[21] Appl. No.: 854,475

[22] Filed: May 12, 1997

Related U.S. Application Data

[63] Continuation of Ser. No. 406,515, Mar. 17, 1995, abandoned, which is a continuation-in-part of Ser. No. 23,299, Apr. 20, 1994, Pat. No. 5,399,901.

[51] Int. Cl.$^6$ .............................. H01L 29/06; H01L 29/74
[52] U.S. Cl. ..................... 257/623; 257/170; 257/171; 257/452; 257/466; 257/586; 257/600; 257/618
[58] Field of Search ..................................... 257/170, 171, 257/452, 466, 496, 571, 586, 594, 600, 618, 623, 624, 625, 626

[56] References Cited

U.S. PATENT DOCUMENTS 3,768,150  10/1973  Sloan, Jr. et al. ...................... 257/623

OTHER PUBLICATIONS

Adolph Blicher, Field–Effect and Bipolar Power Transistor Physics, Academic Press, p. 282, 1981.
B. Jayant Baliga, Modern Power Devices, Krieger Publishing Company, p. 1, 1992.
Dr. Stanley Wolf, Silicon Processing For The VLSI Era, Lattice Press, pp. 1–3, 1986.

*Primary Examiner*—Carl W. Whitehead

[57] ABSTRACT

A semiconductor device comprises a monocrystalline silicon wafer having a major surface lying in the <100> crystal plane. Disposed on the surface is a mesa having a generally square cross-section with generally rounded corners. The mesa has four main side walls each having a slope of around 45 degrees with respect to the base plane of the mesa, and the horizontal edges of the main side walls are disposed at an angle of at least around 12 degrees to the <110> directions on the wafer surface. The corners of the mesa each comprises a number of surfaces also having slopes of around 45 degrees and one surface having a slope of around 54 degrees. A high-low ($N^+ N^-$ or $P^+ P^-$) junction is disposed within the mesa and makes a continuous line intercept with the mesa side walls around the entire periphery of the mesa. Except for exceptionally small deviations of no great significance, the high low junction intercept is at a constant height location entirely around the mesa periphery. The mesa is formed by anisotropic etching using a mask having main sides disposed at an angle of at least around 12 degrees to the <111> directions and rounded corners.

6 Claims, 4 Drawing Sheets

SEMICONDUCTOR DEVICE HAVING A MESA STRUCTURE FOR SURFACE VOLTAGE BREAKDOWN

This application is a continuation of application Ser. No. 08/406,515, filed Mar. 17, 1995, now abandoned, which is a cip of Ser. No. 08/023,299 now U.S. Pat. No. 5,399,901.

BACKGROUND OF THE INVENTION

This invention relates to semiconductor devices having a mesa structure, and particularly to the configuration and fabrication of the mesa structure. The present invention is an improvement of those disclosed in my U.S. Pat. Nos. 4,740,477, 4,891,685 and 5,010,023, the subject matter of which is incorporated herein by reference.

These patents show rectifier devices comprising a mesa structure, particularly a frustum shaped mesa having a circular cross-section. The mesa contains various doped regions including an $N^+ N^-$ junction which is generally parallel to the base plane of the mesa and which intercepts the side wall of the mesa. At the side wall, the surface of the $N^+ N^-$ junction curves slightly upwardly. As explained in the patents, such curvature at the side walls reduces the electric field along the external surface of the mesa and, in general, provides more stable and reliable device operation.

The theory concerning surface voltage breakdown is presented by O. Melville Clark in U.S. Pat. No. 3,260,634 (Jul. 12, 1966) and by R. L. Davies, et al, in "Control of Electric Field at the Surface of P-N Junctions," IEEE Transactions on Electron Devices, July, 1964, pp. 313–323. These publications describe the use of mesas having sloped side walls. In the devices experimented with by Davies et al, sloped walls were obtained by mechanical means, e.g., grinding. However, in semiconductor devices using modern manufacturing techniques, the use of various mechanical means for providing mesa structures is quite impractical.

In my above cited patents, conventional photolithographic techniques are used involving anisotropic etching using a circuit mask. The result, as shown in my patents, are frustro-conical mesas. A problem, however, is that using known anisotropic etching techniques, the actual slope of the mesa wall varies rather significantly from point to point around the periphery of the conical mesa. In general, the mesa conical wall has a slope of around 45 degrees, as measured from the mesa base plane, which is generally desirable, but the wall includes, as an inherent result of the anisotropic etching process, four bulges, disposed at 90 degrees from one another around the mesa periphery, where the wall slope increases to around 54 degrees. These variations in mesa wall slopes tend to provide non-uniform electrical fields around the periphery of the mesa, hence less stable operating conditions. In general, better devices, more easily mass produced, result if slope variations are not present or greatly reduced in size.

My patents also mention the use of a mesa having a generally square cross-section with rounded corners. Although not discussed at length in the patents, what was contemplated, as is typical in the semiconductor device art, is a mesa having four main side walls with each pair of adjacent side walls being interconnected by a curved corner wall. Typically, the side walls have a slope of about 54 degrees with respect to the base of the mesa (higher angular slopes correspond to steeper slope sides) and the corner walls have slopes of about 45 degrees. Again, such variations in mesa wall slopes are generally undesirable as tending to complicate manufacture of the devices.

In general, as discussed more fully hereinafter, more stable voltage breakdown characteristics are obtainable the smaller is the slope of the mesa because smaller slopes practically always result in smaller electric field values along the mesa side walls. However, when different slopes are present around the periphery of the mesa, the locations of surface intercepts of various junctions within the mesa also vary around the mesa periphery. Stable voltage breakdown characteristics require that the surface intercepts be passivated. It turns out, however, that proper passivation in most practical cases is a function of the location of the surface intercepts, and it is quite difficult and more expensive to design a single passivation scheme, suitable for use in mass production procedures, which is optimum for differently located surface intercepts.

SUMMARY OF THE INVENTION

In accordance with this invention, a device mesa is provided having a constant first slope almost entirely around the mesa periphery. At corners of the mesa, small wall areas are present having a second, different slope, but, as described hereinafter, the surface intercepts of junctions along those small wall areas are substantially identically located as are the junction surface intercepts in the mesa walls of the first slope. Accordingly, optimum passivation of all the surface intercepts is more readily achieved.

A semiconductor device comprises a monocrystalline silicon wafer having a major surface lying in the {100} crystal plane. Disposed on the surface is a mesa having a generally square cross-section with generally rounded corners. The mesa has four main side walls each having a slope of around 45 degrees with respect to the base plane of the mesa, and the horizontal edges of the main side walls are disposed at an angle of at least around 12 degrees to the <110> directions on the wafer surface. The corners of the mesa each comprises a number of surfaces also having slopes of around 45 degrees and a single surface having a slope of around 54 degrees. A high-low ($N^+ N^-$ or $P^+ P^-$) junction is disposed within the mesa and makes a continuous line intercept with the mesa side walls around the entire periphery of the mesa. Except for exceptionally small deviations of no great significance, the high-low junction intercept is at a constant height location entirely around the mesa periphery. A method of fabrication comprises etching a wafer using a properly oriented rectangular mask having rounded corners.

A method of fabrication of the devices comprises forming an etchant mask on a {100} lane surface of a monocrystalline silicon wafer. The mask has a generally square shape with straight sides meeting at generally rounded corners. The mask straight sides are disposed at an angle of at least 12 degrees with the <110> directions on the silicon surface. The mask corners, for a mask having four main sides, encompass 90 degrees of arc, and include a point at which the <110> direction is tangent. From such point, the mask edge comprises two oppositely extending straight lines each forming an angle of at least around 12 degrees to the <110> direction, the two lines thus forming an angle of not greater than about 156 degrees. The oppositely facing ends of the two straight lines join respective third lines which curve generally smoothly to merge with the mask main sides at opposite ends of the corner. The silicon wafer is then immersed in an etchant for anisotropically etching the silicon for forming a mesa underlying the etchant mask. Doped regions are provided in the mesa having a high-low junction therebetween which forms a surface intercept with the mesa side walls. Then, as described in my afore-cited patents, the workpiece is heated for causing the high-low junction to move deeper into the mesa for providing a desired configuration of the surface intercept of the high-low junction with the mesa side walls.

DESCRIPTION OF THE DRAWING

The drawings are schematic and not drawn to scale.

DESCRIPTION OF PREFERRED EMBODIMENTS

Similarly as in my afore-cited patents, the semiconductor device of the present invention utilizes a mesa structure to obtain improved breakdown voltage characteristics and particularly a higher breakdown voltage at the surface of the device. This result is accomplished by providing a high ohmic region in between heavily doped P-type and N-type regions wherein the width of the high ohmic region is greater at its edges than in the central portion thereof, and the doping of the high ohmic region is such that the breakdown voltage is more dependent upon the width than upon the doping. Since the high ohmic portion is wider along the sloped side wall of the mesa than in the bulk semiconductor material, a higher breakdown voltage can be achieved at the surface of the mesa than within the bulk of the mesa. As known, this is generally desirable for improving device reliability and utility and, in general, the greater the increase in width of the high ohmic portion along the sloped side wall, the greater are the device improvements. However, as previously indicated, also of importance is that variations in surface electric fields caused by variations in slopes around the periphery of the mesa be minimized. This is accomplished according to this invention.

An example of a first embodiment according to the invention is now described.

Up until the fabrication of the mesa structure, semiconductor devices according to the present invention can be fabricated exactly as described in my patents using known parameters, e.g., dimensions, doping concentrations, and the like.

Thus, starting with a monocrystalline silicon wafer 10 (FIG. 1) having a {100} crystal orientation, that is, having a major surface 12 perpendicular to a <100> crystal axis, and with the wafer 10 being of $P^+$ conductivity type, a layer 14 of $N^-$ crystalline silicon is epitaxially grown on the surface 12 of the wafer 10. The grown layer 14 is automatically oriented similarly as the surface on which it is grown, hence the surface 16 of the layer 14 also lies in the {100} crystal plane. The interface 12 between the layer 14 and the wafer 10 comprises an $N^-P^+$ junction. Impurities, e.g., phosphorus atoms, are deposited, e.g., by ion implantation, within a thin layer at the top of the epitaxial layer 14 to form a high concentration $N^+$ region 18. Then, a silicon nitride layer 20 is deposited on the upper surface 16 of the layer 14 and, using known photolithographic processes, the nitride layer 20 is patterned into an etchant mask 22 as shown in FIG. 2. (FIGS. 1 and 2 show but one device being made on a "wafer." Typically, as known, many devices are simultaneously made on a wafer which is later diced into separate device "chips.")

Figure 1:
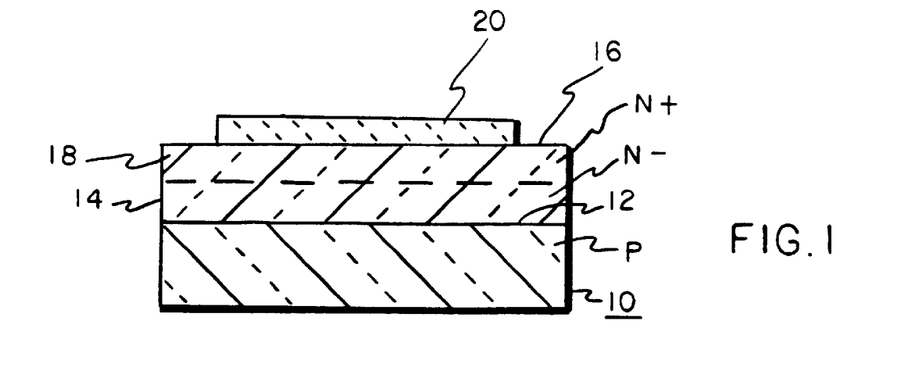
FIG. 1 is a cross section of a silicon wafer having an etchant mask on a surface of the wafer.
Figure 2:
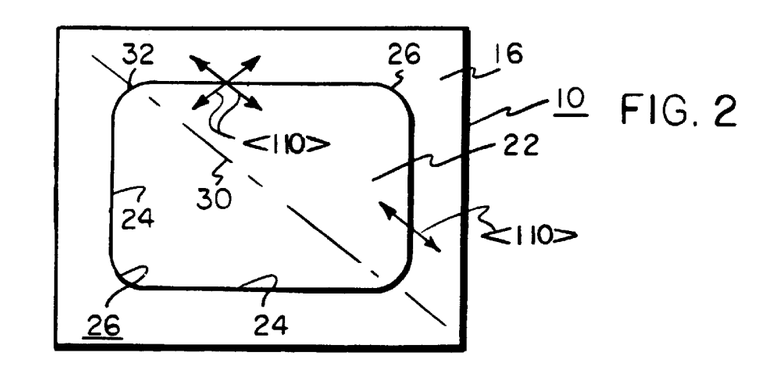
FIG. 2 is a plan view of the wafer shown in FIG. 1.

The wafer 10 shown in FIGS. 1 and 2 is to be fabricated into a rectifier. The invention is not limited to rectifier devices but can be sued in any number of different devices employing mesa structures. For example, by adding a P type region within the $N^+$ region 18, a transistor type device can be made. Various semiconductor devices employing mesas are known, hence illustration and description thereof are not necessary.

Returning to consideration of FIG. 2, both the orientation and configuration of the mask 22 are of importance.

First, as shown in FIG. 2, the mask 22 has four straight sides 24 forming a square, although a rectangular shape can also be used. Each of the four sides 24 is disposed at least in excess of some angle relative to the <110> directions on the wafer surface 16. (In {100} silicon crystals, two <110> directions are present on the surface at right angles to one another.) It is not known precisely what such "some" angle is, but it is believed to be around 12 degrees. As a practical matter, particularly in mass production situations, it is difficult to precisely angularly orient photomasks with silicon wafer surfaces, and it is convenient to specify the minimum ("some") angle between the main sides 24 of the mask and the <110> directions as being 15 degrees. In the embodiment illustrated in FIG. 2, the mask 22 is shown with its main sides disposed at an angle of 45 degrees to the <110> directions. As described hereinafter, with the specified minimum "some" angle of 15 degrees, the mask 22 can be rotated plus or minus 30 degrees from the orientation shown in FIG. 2 while still preserving the minimum angular deviation. (That is, considering the crossed <110> direction arrows shown in FIG. 2, rotation of the mask 22 in excess of 30 degrees in either direction will orient a mask side within 15 degrees of one of the <110> directions.)

As described hereinafter, anisotropic etching is used to form a mesa structure beneath the etchant mask 22. Anisotropic etching is well known for forming various sloped surfaces in silicon crystals, e.g., surfaces of mesas, cavities and trenches. To my knowledge, in conventional practice, when using wafers having major surfaces lying in the {100} plane, the sides of rectilinear etchant masks are aligned parallel to the <110> directions. As known, such alignment of the mask edges results in etched side walls a having a 54 degree slope, and corner walls having a 45 degree slope. By disposing the sides 24 of the mask 22 (FIG. 2) at 45 degrees to the <110> directions, in accordance with this embodiment (and in excess of the aforementioned "some" angle of around 15 degrees), the etched walls defined by the mask sides 24 have slope of 45 degrees substantially uniformly around the entire periphery of the mesa except for small portions of the mesa corners where a 54 degree slope occurs. However, as hereinafter described, the presence of such slope variations of slope at the mesa corners does not introduce undesirable variations in device characteristics.

Figure 3:
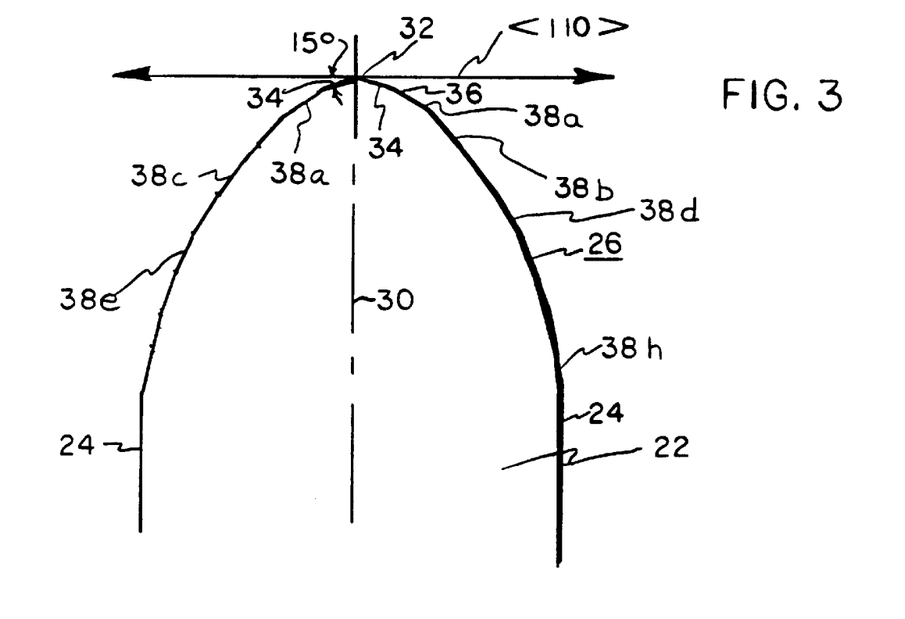
FIG. 3 is an enlarged view of a corner of the etchant mask shown in FIG. 2, the curvature of the corner being shown greatly exaggerated.

As shown in FIG. 2, the corner 26 of the mask 22 are generally rounded. An enlarged corner 26 is shown in FIG. 3, where the corner is seen to consist of straight lines. (In FIG. 3, the curvature of the corner is shown greatly exaggerated for ease of illustration.) Such straight lines result from the use of photomasks generated using known computer aided mask making tools. Typically, the computer prints out the desired photomask image edges using tiny straight lines. Provided the basic shape of the corner 26 schematically illustrated in FIG. 3 is maintained, certain ones of the straight lines shown can be replaced with a smoothly curved line.

The corner 26 is symmetrical about a axis 30 passing through a mid-point 32 of the corner edge. In FIG. 2, with a square shaped mask 22, the axis 30 is a diagonal of the square.

Starting from the mid-point 32, the corner edge consists of two straight lines 34 meeting at a point 32 at which the <110> direction is tangent to the corner. At point 32, the two lines form an angle of 150 degrees. FIG. 3 shows the crystal <110> direction (disposed at 45 degrees to the mask straight sides 24, as previously noted, but appearing at a different angle in FIG. 3 because of the curvature exaggeration shown in FIG. 3), and each line 34 is disposed at an angle of 15 degrees from the <110> direction.

The angular orientation of the corner lines 34 relative to the <110> direction results in mesas having desired slopes at the mesa corners. As previously noted, I have observed that with etchant masks having edges which are oriented more than about 12 degrees from the <110> directions on silicon surfaces lying in the {100} plane, the walls anisotropically etched at the mask edges have a consistent, and desirable, slope of 45 degrees. Conversely, if the mask edges are disposed less than about 12 degrees from the <110> directions, different slopes up to around 54 degrees result. As also previously mentioned, owing to manufacturing tolerances in aligning wafers, an angle of 15 degrees relative to the <110> direction is specified for the corner lines 34.

From each end 36 of the lines 34, eight short lines 38a–38h complete the corner sides and merge with the straight sides 24 of the mask 22. With the lines 34 being disposed at 15 degrees relative to the <110> directions, the eight lines 38a–38h must provide a total curvature of 30 degrees for each half of a corner.

Preferably, the angular deviation from a straight line at the intersections of each pair of the eight lines 38a–38h is 3.75 degrees (that is, seven angles of 3.75 degrees at each intersection, for a total curvature of 26.25 degrees), and the angular deviation between the first line 38a and the mid-point line 34 and between the last line 38h and the mask straight side 24 is 1.875 degrees (for an added curvature of 3.75 degrees, thus adding up to the previously mentioned curvature of 30 degrees).

Figure 4:
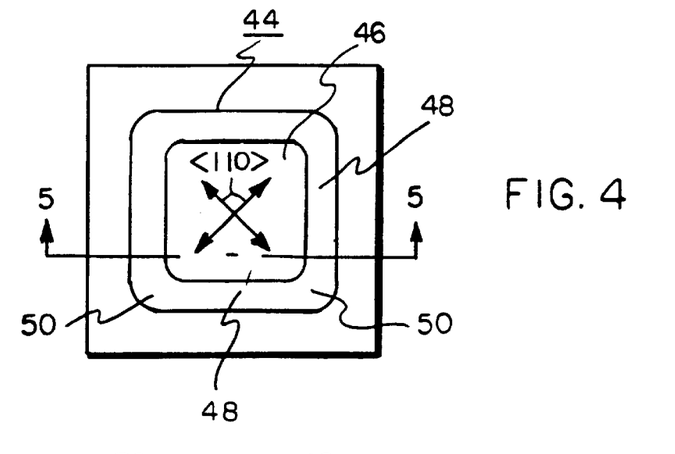
FIG. 4 is a view similar to FIG. 2 but after the wafer has been anisotropically etched to provide a mesa structure.
Figure 5:
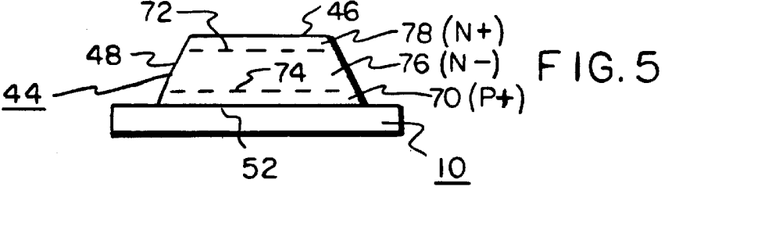
FIG. 5 is a cross sectional view taken along line 5—5 of FIG. 4.

With the mask 22 in place, the masked silicon wafer is then anisotropically etched using a known anisotropic etchant, e.g., hot ethylene diamine. The result of such etching process is shown in FIGS. 4 and 5. For purposes of illustration, the resulting mesa structure 44 is shown with the silicon nitride mask 22 removed and with the side of the mesa without any covering layer. The actual sequence of processes used is as disclosed in my patents, where the etchant mask is not removed until the sides of the mesa are covered with a grown layer of silicon dioxide.

Comparing the top surface 46 of the mesa 44 shown in FIG. 4 with the mask 22 shown in FIG. 2, it is seen that the shape of the mesa top surface 46 closely matches that of the mask 22.

The mesa structure 44 is, in conformity with the mask 22, in the shape of a square having four major side walls 48 and four generally rounded corner walls 50. As a result of the mask side edges having been disposed at 45 degrees to the <110> crystal directions (i.e., more than the aforementioned 15 degrees), the mesa major side walls have (FIG. 5) uniform slopes of 45 degrees with respect to the base plane 52 of the mesa 44.

Figure 6:
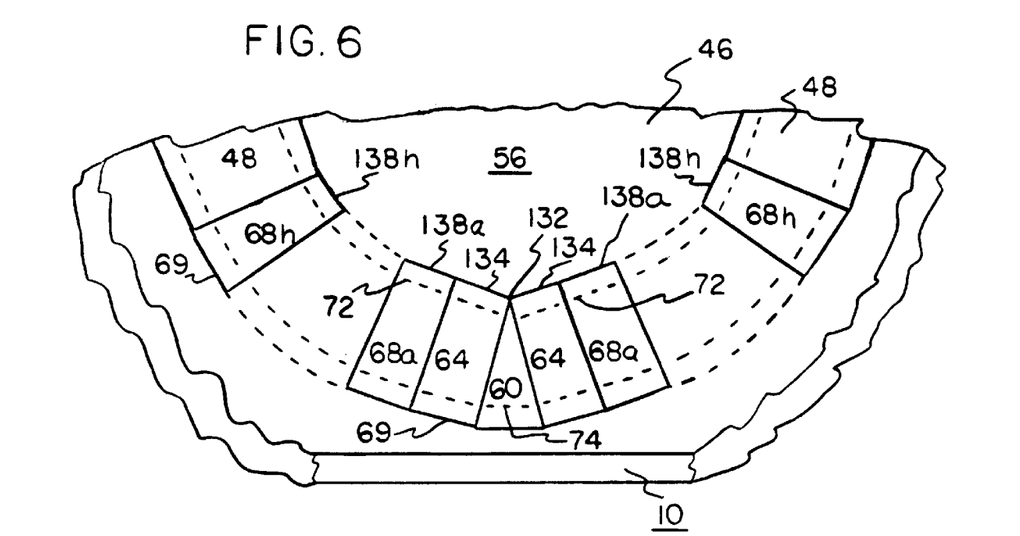
FIG. 6 is a perspective view, on an enlarged scale, of a corner of the mesa shown in FIG. 4, the curvature of the corner being shown greatly exaggerated.

The corner walls 50 likewise have slopes of 45 degrees, but with the exception of one surface which has a slope of around 54 degrees. One mesa corner 56 is shown in FIG. 6. In FIG. 6, the curvature of the corner edges is arbitrarily selected for convenience of illustration.

The upper surface 46 of the mesa at the corner 56 conforms substantially to the shape of the corner 26 of the mask 22 shown in FIG. 3 (but with a different illustrated curvature), and reference numerals corresponding to those used in FIG. 3 for the mask 22 are used in FIG. 6 for the resulting mesa. Thus, the corner 56 includes a mid-point 132 from which two lines 134 diverge, followed by eight end-to-end lines 138a–138h. The corner wall 50 includes nineteen facets, eighteen of which have approximately the same slope. Thus, starting from the corner mid-point 132, a triangular facet 60 is present which has a slope, between the facet plane and the horizontal base plane 52 (FIG. 5) of the mesa 44, of 54 degrees. That is, the facet 60 lies in one of the {111} planes of the silicon crystal.

The triangular facet 60 is connected to each of the mesa straight walls 48 by a series of nine facets 63 and 68a–68h, each extending from one of the straight lines 134 and 138a–138h, respectively, at the top edge of the mesa to the mesa base edge 69. The slopes of the nine facets 64 and 58a–68h are all about 45 degrees.

FIG. 5 shows the location of the differently doped regions within the mesa 44. As shown, the region 70 of P$^+$ conductivity originally present in the starting wafer 10 (FIG. 1) now extends into the base of the mesa. This results from a diffusion of the P$^+$ dopants in the wafer 10 into the overlying epitaxial layer 12 during various temperature treatments to which the workpiece is exposed. Also, although the various junctions 72 and 74 (FIG. 5) between the differently doped regions (P$^+$ region 70, N$^-$ region 76 and N$^+$ region 78) now form surface intercepts with the side walls of the mesa 44, the junctions 72 and 74 lie in parallel planes.

In the present embodiment, the starting silicon wafer 10 (FIG. 1) includes the various P$^+$, N$^-$ and N$^+$ regions. Alternatively, the N$^+$ region 78 (FIG. 5) can be added, e.g., by ion implantation, after the mesa structure 44 has been formed. The device shown in FIG. 5 is then heated for diffusing impurities in the upper N$^+$ region 78 deeper into the mesa 44. As before, for ease of illustration, the masking layer 22 (FIG. 2) and a passivating layer of silicon dioxide present during such diffusion step are not shown.

Figure 7:
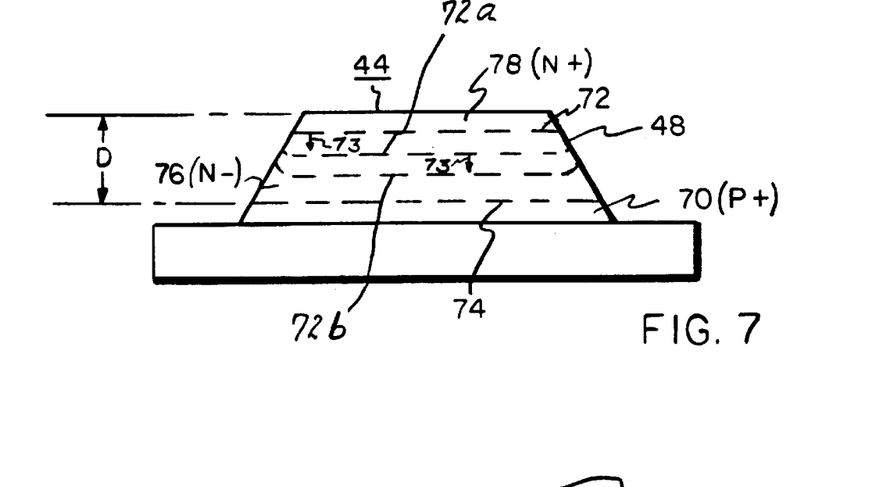
FIG. 7 is a view similar to FIG. 5 and illustrating the effect of heating the wafer for causing diffusion of dopants within the mesa downwardly and laterally within the mesa.

As illustrated in FIG. 7, as the N$^+$ region 78 diffuses downwardly into the mesa, as indicted by the arrows 73, the N$^+$N$^-$ junction 72 (shown at three successive positions 72, 72a, and 72b within the mesa 44) between the N$^+$ region 78 and the N$^-$ region 76 takes on an increasingly large curvature along the mesa walls. Such curvature results from the facts that, within the bulk of the mesa, the areas of successively deeper levels of the mesa remain constant, and the concentration of dopants in the advancing diffusion front diminish uniformly across the diffusion front. Along the mesa sloped sides, however, the area of the $N^+N^-$ interface 72 increases with depth, and the diffusion front into the expanding area has a circular shape of constantly growing diameter with increases of lateral area. The concentration of the dopants in the diffusion front along the mesa sides thus decreases more rapidly than in the bulk of the mesa, and the curvature of the junction 72 along the mesa side walls increases with the depth of the junction beneath the mesa top surface. The variable rate of dopant concentration change is discussed in somewhat greater detail hereinafter.

An advantage by such curved $N^+N^-$ junction 72 is that the thickness of the $N^-$ region 76 is greater at the mesa sides than in the interior of the mesa 44. Because, with low enough doping, voltage breakdown across a given $N^-$ region is a function of the thickness of the region, the voltage breakdown characteristic at the surface of the mesa sides is greater than that within the mesa interior.

The foregoing is known and described in my patents.

In general, subject to certain limitations not necessary to discuss here, the rate of curvature increase of the $N^+N^-$ junction is inversely related to the angle of slope of the mesa side walls relative to the mesa base plane. (with perfectly vertical, 90 degree sloped walls, for example, no increase of area with diffusion depth occurs, and little or no junction curvature results.)

As discussed in the Background of the Invention Section herein, a problem with the frustro-conical mesas disclosed in my afore-cited patents is that bulges are present in the mesa side walls where the slope increases from 45 degrees to 54 degrees. In such bulges, the junction curvature is reduced in proportion as the side wall slope increases, and the side wall electric field reduction and possible voltage breakdown capability is accordingly reduced. Because the operating characteristics of the rectifier device must take into account all possibilities of surface breakdown, the operating characteristics of the rectifier are determined solely by the surface breakdown characteristics present at the 54 degree sloped bulges and not by the superior characteristics present at the 45 degree sloped walls. In effect, the 45 degree slope is "wasted."

In accordance with the present invention, however, the exact opposite result is achieved. Thus, in spite of the presence of mesa side walls (the corner facets 60) having slopes of 54 degrees, the rectifier device functions as if all the walls have a slope of substantially 45 degrees. The inventive rectifiers thus take full advantage of the 45 degree sloped walls and are not limited, as in the past, by the presence of 54 degree sloped walls.

Figure 8:
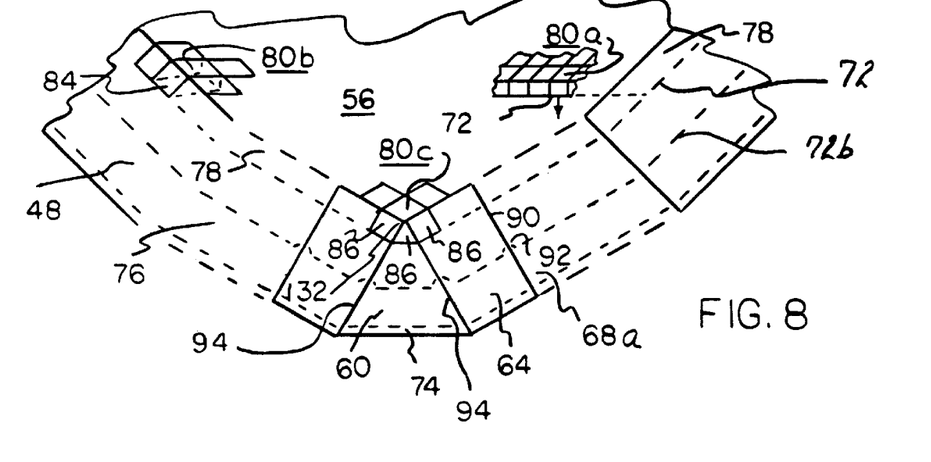
FIG. 8 is a view similar to that of FIG. 6 illustrating the dopant diffusion process.

The reason for this desirable result is illustrated in FIG. 8.

Shown in FIG. 8 are various "unit cubes" 80 within and extending from top to bottom of the $N^+$ region 78. One unit 80a is disposed inwardly of the edges of the mesa and is surrounded on all sides by similar units. Another unit 80b is disposed along a straight side 48 of the mesa and is adjoined on three sides by adjacent units, but not along the side 84 which forms part of the sloped wall 48 of the mesa. A third unit 80c is disposed at the mid-point 132 of the corner 56 and is adjoined on two sides by adjacent units. Three sides 86 of the unit 80c form part of the sloped walls meeting at the corner mid-point 132.

During the previously described heating step, dopants in each of the various unit cubes diffuse downwardly into the underlying $N^-$ region. The direction of diffusion is a function of the dopant gradient, and diffusions can occur vertically and laterally.

In the case of the unit cube 80a disposed interiorly of the mesa, all diffusion of dopants from within the cube can be assumed to occur directly downwardly because, in directions to any side of the unit cube 80a, similar downward diffusions from adjoining unit cubes are occurring.

In the case of the unit cube 80b at the straight side 48 of the mesa, owing to the slope of the mesa wall 48, the area of the $N^-$ region 76 to the left (as illustrated) of the cube side 84 increases in proportion to the depth of diffusion. Accordingly, lateral diffusion of dopants from the unit cube 80b in the direction of the left side 84 of the cube occurs simultaneously with downward diffusion of dopants from the cube. The result is that depletion of dopants from the unit cube 80b occurs more rapidly than the depletion of dopants from the interior unit 80a, and the advance of the $N^+N^-$ junction 72 beneath the unit cube 80b proceeds more slowly than beneath the interior unit cubes. Accordingly, the $N^+N^-$ junction 72b curves upwardly at the mesa sides as shown in FIG. 7.

In the case of the unit cube 80c at the mesa corner, the area of the underlying $N^+$ region 76 expands in three directions with increases of mesa depth, i.e., in the directions of the three sides 86 of the cube forming the mesa corner walls, hence lateral diffusion from the cube 80c also occurs in three directions. Accordingly, the $N^+N^-$ junction 72 underlying the unit 80c tends to lag even behind the rate of advance of the $N^+N^-$ junction beneath the unit cube 80b.

As previously explained, the rate of advance of the $N^+N^-$ junction is a function of the slope of the side wall of the mesa. For slope angles measured with respect to the base plane of the mesa, the rate of advance is inversely proportional to the slope angle. The smaller the rate of advance, the greater is the curvature of the $N^+N^-$ junction at the mesa sides.

At the mesa corners, the slope of the triangular plane 60 (FIG. 6) at the corner mid-points 132 is 54 degrees and, based solely upon the relative slopes, it would be expected that the curvature in the plane of the $N^+N^-$ junction 72b at the corner triangular planes 60 (of 54 degree slope) would be less than along the mesa straight sides (of 45 degree slope). However, owing to the greater lateral diffusion which occurs with increasing mesa depth beneath the corner mid-points 132, the actual curvature in the $N^+N^-$ junction 72b adjacent to the triangular planes 60 is comparable to that near the straight sides of the mesa.

The actual curvature from point to point around the corners is a function of the wall slope at each point and the extent of the external exposure of the sides of the unit cubes at each point. This is illustrated in FIG. 8 which shows the surface intercept of the $N^+N$ junction 72b around the corner after the diffusion step. In terms of the overall device design and characteristics, optimum results are obtained if the distance between the surface intercept 72b and the $N^-P^+$ junction 74 at the base of the mesa is substantially uniform around the entire periphery of the mesa. As shown in FIG. 8, this condition is met in spite of the fact that the slopes at the mesa mid-corners are greater than the slope at the mesa straight sides.

With respect to the corner facets 64 and 68a–68h, all these facets have a slope of about 45 degrees, as previously explained, hence have the same slope as that of the main side walls 48 of the mesa structure 44. Accordingly, the $N^+N^-$ junction surface intercept 72b along these facets and main side walls comprises a generally straight line substantially everywhere parallel to the surface intercept of the $N^-P^+$ junction 74.

Quite minor exceptions to the foregoing statement occur along the various vertical edges where the different facets adjoint one another. At such edges, e.g., the edge 90 between adjacent facets 64 and 68a, a slight cusp 92 is present. This occurs because of lateral diffusion that occurs in two directions at the vertical edge resulting, as above described, in a slight lagging behind of the downward movement of the $N^-N^+$ junction 72. However, owing to the extremely small deviation from a straight line (e.g., the aforementioned 3.75 degrees) which exists between the two facets 64 and 68a, the effect of the edge 90 therebetween is so small that, for all practical purposes, the presence of the cusp 92 can be ignored. To the extent that the various mesa top edges 134 and 138a–138h intersect at more acute angles, e.g., with deviations from straight lines in excess of the specified 3.75 degrees, the cusps 92 are of greater dimensions and provide the device with greater variability of device characteristics. This is preferably avoided. In general, and dependent upon the particular device being made, the maximum angular deviation from a straight line between end to end connected mesa edges 134 and 138a–138h is not greater than about 10 degrees.

Now discussed are the lengths of the mask 22 (FIG. 3) corner sides.

Figure 9:
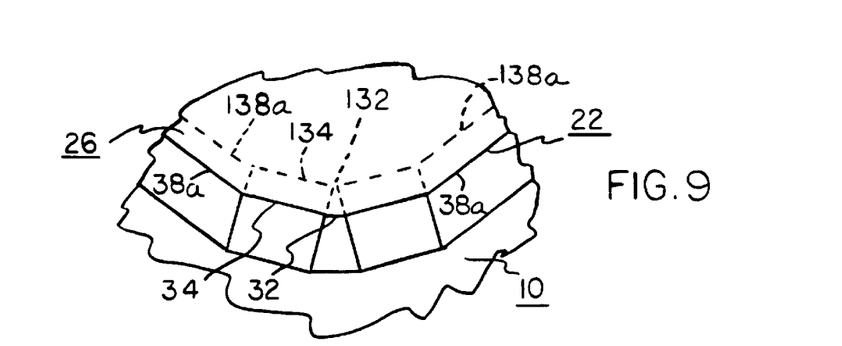
FIG. 9 is a plan view of a portion of a corner of an etched mesa structure with the etchant mask still in place.

During etching of the mesa structure, etching of the silicon occurs laterally beneath the etchant mask 22 as well as vertically. This is indicated in FIG. 9 which shows, in dashed lines, the position of the mesa top surface corner edges 134 and 138a inwardly of the mask corresponding edges at the conclusion of the etching process. Because of the curvature at the mask corners 26, the lengths of the various etched back mesa top edges 134 and 138a (as well as the other edges 138b–138h, not shown) are shorter than the corresponding mask edges 34 and 38a. The amount of undercutting of the mask edges is a function of the height of the mesa. With 45 degree sloped mesa walls, for example, the lateral etching of the silicon wafer equals about half of the vertical etching thereof. With increasing vertical and accompanying lateral etching, the mesa corner top edges get shorter and shorter and, unless the mesa edges have a minimum length at the start of the etching process, can become too short.

As previously explained, at the various vertical edges between adjoining corner facets, e.g., the edge 90 (FIG. 8) between the adjacent facets 64 and 68a, there is a tendency for a cusp 92 to form in the $N^+N^-$ junction surface intercept 72b. Such cusp occurs because of the curved diffusion front of the lateral diffusion of impurities from "unit cubes" disposed overlying the vertical edges. It also occurs that if the mesa top edges 134, 138a–138h become excessively short, the volume of the $N^+$ doped region 78 available to provide dopants for lateral diffusions into closely spaced apart facet vertical edges is inadequate to provide all the dopants needed. Accordingly, the various cusps 92 become event larger and introduce larger undesirable variations in the characteristics of the device.

The minimum lengths of the mesa corner edges is a function of various device design parameters, e.g., the vertical location of the $N^+N^-$ surface intercept 72b on the mesa side walls, the doping concentrations used and the permitted variation in device characteristics. As a general rule, however, in order to obtain mesa corner top edges of adequate lengths at the conclusion of the etching process, the lengths of the various lines 34 and 38a–38h of the mask 22 (which lengths determine the lengths of the mesa edges at the start of the etching process) are preferably equal to a distance, from the top surface 46 of the mesa structure, to below the depth of the $N^+N^-$ junction surface intercept, and, in general, about equal to about the depth of the N $P^+$ junction 74 in the mesa structure. In FIG. 7, such depth is indicated by the dimension D.

Taking into account the specified angular orientations between the various lines 34 and 38a–38h of the mask 22 and the foregoing specified lengths of these lines, it is possible to specify the mask corner dimensions in terms of the arc lengths thereof. Specifically, for each curvature of six degrees, the length of the mask corner edge should be equal to or larger than the distance D.

The lengths of the mask lines 34 and 38a–38h in excess of the above-specified minimum lengths are not critical. As these lines become larger and larger, the mask corners become larger and larger, and the mask, and resulting mesa structure, deviate more and more from a square and become increasingly circular. As a practical matter, chips diced from wafers generally have a square shape, and for maximum usage of the silicon within the chips, the mesa structures also have a square shape. Accordingly, to the extent that the mesa corners become increasingly large, silicon area is wasted, and the power handling capacity of the device is reduced. To minimize such wastage, the corners are made as small as possible and, in one embodiment, comprise edges of the previously described minimum lengths. Again, as a practical matter, the corners actually comprise but a small portion of the overall mesa structure, and it is possible to use corner edges having lengths well in excess of the minimum lengths without significant change in the overall area of the mesa structure.

Summarizing the foregoing, the desired results are obtained by orienting the mesa etchant mask with respect to the silicon crystal directions such that, after anisotropic etching, the main side walls of the mesa having slopes of around 45 degrees. This is a preferred slope for obtaining a high voltage breakdown characteristic. Using anisotropic etching, it is not possible that all the mesa side walls have a 45 degree slope, but using the aforedescribed mask orientation, even the mesa corner walls have a 45 degree slope with the exception of a single triangular facet at the center of each corner which has a slope of around 54 degrees. However, because of both the shape and location of this facet, the high-low junction surface intercept along this facet (of 54 degree slope) is spaced approximately the same distance from the P-N junction as are the high-low junction surface intercepts in all the other mesa side and corner walls of 45 degree slope. The resulting mesa thus has uniform characteristics around the entire mesa periphery and the generally favorable electric field, surface stability and voltage breakdown characteristics of 45 degree sloped walls in comparison with 54 degree walls.

Figure 10:
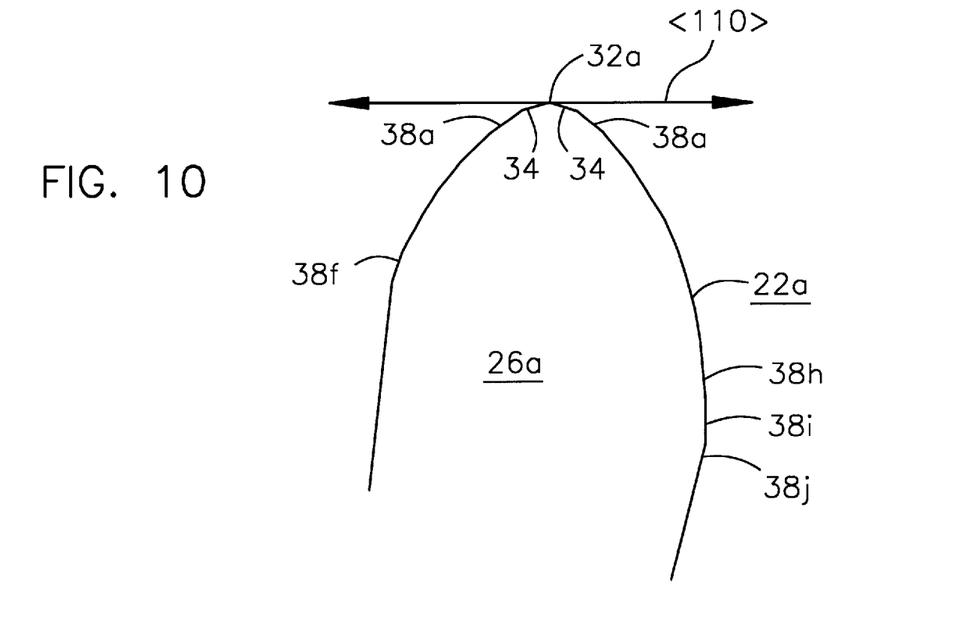
FIGS. 10 and 11 are similar to FIG. 3 except showing respective mask corners used when masks similar to that shown in FIG. 2 are used at respectively different orientations from that shown in FIGS. 2 and 3.
Figure 11:
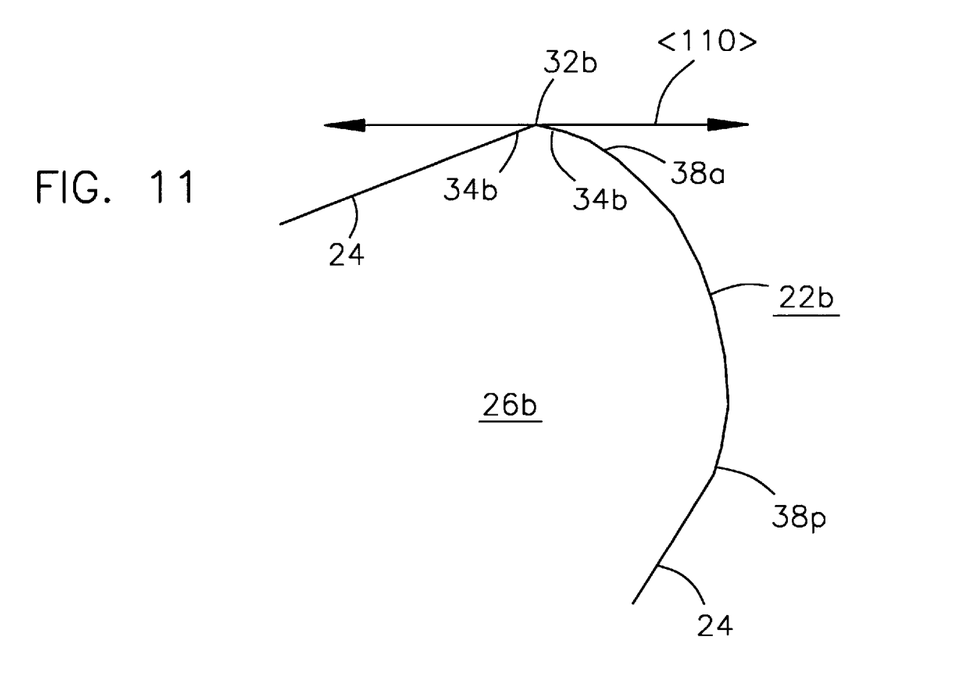

In the embodiment so far described, the etchant mask 22 (FIG. 2) is aligned with the main sides 24 disposed at an angle of 45 degrees to the crystal surface <110> directions. This results in the mesa side walls 48 (FIG. 5) having a 45 degree slope. As mentioned, however, a wall slope of 45 degrees is obtained provided the defining mask edge is disposed in excess of the previously specified 15 degrees from a <110> direction. Accordingly, the desired mesa configuration can be obtained even with the mask 22 rotated relative to the orientation shown in FIG. 2 by as much as plus or minus 30 degrees. This is illustrated in FIGS. 10 and 11 which are generally similar to FIG. 3 in that they show the shape and orientation of corners 26a (FIG. 10) and 26b (FIG. 11) of generally square masks such as the mask 22 shown in FIG. 2. FIG. 2 shows a mask 22 having main sides 24 disposed at 45 degrees to the silicon directions <110>.

FIG. 10 shows a mask 22a rotated clockwise an arbitrary amount, e.g., 7.5 degrees from the orientation shown in FIG. 2, and FIG. 11 shows a mask 22b rotated the maximum permitted amount (e.g., around 30 degrees) from the orientation shown in FIG. 2. The rotations of the masks 22a and 22b relative to the mask 22 require corresponding changes in the configurations of the mask corners. The nature of these changes is now described by comparison with the mask 22 corner 26 illustrated in FIG. 3.

In FIG. 3, the mask corner 26 is symmetrical, and the mid-corner point 32 is located on the axis 30 of symmetry of the corner 26. Of significance, the <110> direction illustrated in tangential to the corner 26 at the point 32, and the point 32 is disposed at the intersection of two straight lines 34.

With a mask 22a (FIG. 10) rotated 7.5 degrees from the FIG. 3 orientation, a <110> direction is still tangent to the corner 26a at a point 32a, but the corner 26a is no longer symmetrical, and the point 32a is not disposed midway along the length of the corner. Rather, the point 32a moves counterclockwise around the corner in correspondence to the clockwise rotation of the mask 22a relative to the mask 22.

In the example illustrated in FIG. 10, corresponding to a rotation of 7.5 degrees, such rotation corresponds exactly to the angular length of two of the eight sides 38a–38h shown in FIG. 3, and to accommodate the necessary re-orientation of the corner 32a, two of the eight sides 38a–38h shown to the left of the point 32 in FIG. 3 are moved to the right of the point 32a shown in FIG. 10. Accordingly, the corner 26a contains, in addition to the two lines 34, six lines 38a–38f to the left of the point 32a and eight lines 38a–38j to the right of the point 32a. All other parameters of the corner 26a remain identical to those of the corner 26.

Similarly, in FIG. 11, the point 32b (defined as that point where a <110> direction is tangent to the mask corner) is moved completely to the left hand edge of the corner 26b where the corner 26b joins the main side 24 of the mask. However, the side 24 is here also oriented 15 degrees from a <110> direction (the specified orientation of the mask 22b illustrated in FIG. 11), with the result being that the straight line 34b to the left of the point 32b is actually part of the left hand main side 24 of the mask 26b.

In this embodiment, the 90 degree arc of the corner 26b is made up of the 30 degree angle between the straight line 34b to the right of the point 32b and an extension of the left hand main side 24 plus 56.25 degrees formed by sixteen lines 38a–38p at 3.75 degrees to one another (forming 15 angles) plus the remaining 3.75 degrees provided at the lines 38a–34b and 38p–24.

There is actually no preferred orientation of the mask 22 relative to the <110> directions provided the minimum off-set of around 15 degrees (as a practical matter) is maintained.

As previously explained in connection with FIGS. 4–6 and 9, the top surface 46 of the mesa 44 formed after the anisotropic etching step conforms quite closely in shape to that of the etchant mask 22, with the exception (FIG. 9) that the mesa edges 134, 138a, etc. are somewhat shorter than the corresponding mask edges 34, 38, etc. Such shape conformity means that the shape of the mesa upper surface is substantially the same from device to device whether made on a common wafer or from different wafers. This is quite desirable because, after formation of the devices to the manufacturing stage shown in FIGS. 7 and 9, further known processing steps including a photomask registration process are generally required, and such registration process is greatly facilitated dependent upon the similarity of the devices being fabricated.

Heretofore, and particularly in situations where spaced apart bulges are present on the mesa side walls, rather significant variations in the shape of the mesa top surface are also generally present from device to device. This occurs because the shape of the mesa top surface is a function of the shape and location of the side wall bulges and, it so happens, these bulge parameters are extremely sensitive to quite small and generally unavoidable processing variations.

In the mesas produced according to the invention, mesa bulges are eliminated. Accordingly, while the invention has been described as having utility with mesas containing P-N junction, the invention also has utility wherever precisely dimensioned and shaped mesas are useful.

What is claimed is:

1. A semiconductor device comprising a monocrystalline silicon wafer having a major surface lying in the {100} crystal plane, a generally rectangular mesa structure extending upwardly from said surface, said mesa structure having spaced apart top and bottom surfaces interconnected by four side walls meeting at corner walls, horizontal edges of said side walls being disposed at an angle of at least about 12 degrees to <110> directions on said major surface, each of said corner walls comprising a triangular facet lying in a {111} crystal plane, and a plurality of planar second facets extending between one side of said triangular facet and one of said side walls, the planes of adjoining second facets being angularly off-set from one another, and the slopes of said second facets, with respect to said mesa structure bottom surface, being about 45 degrees.

2. A device according to claim 1 wherein the angular off-set between adjoining second facets is equal to or less than 4 degrees.

3. A semiconductor device comprising a monocrystalline silicon wafer having a major surface, a generally rectangular mesa structure extending upwardly from said surface, said mesa structure having spaced apart top and bottom surfaces interconnected by four side walls meeting at corner walls, each of said corner walls comprising a triangular facet and a plurality of rectangular second facets extending serially between one side of said triangular facet and one of said side walls, the planes of adjoining second facets being angularly off-set from one another, and the slopes of said side walls, said triangular facet and said second facets, all with respect to said mesa structure bottom surface, being around 45, 54 and 45 degrees, respectively.

4. A device according to claim 3 wherein the angular off-set between adjoining second facets is equal to or less than 4 degrees.

5. A semiconductor device comprising a monocrystalline silicon wafer having a major surface lying in the {100} crystal plane, a generally rectangular mesa structure extending upwardly from said surface, said mesa structure having spaced apart top and bottom surfaces interconnected by four side walls meeting at corner walls, horizontal edges of said side walls being disposed at an angle of at least about 12 degrees to <110> directions on said major surface, each of said corner walls comprising a triangular facet lying in a {111} crystal plane, and the slopes of said side walls and said triangular facets, with respect to said mesa structure bottom surface, being about 45 degrees and 54 degrees, respectively.

6. A semiconductor device comprising a monocrystalline silicon wafer having a major surface, a generally rectangular mesa structure extending upwardly from said surface, said mesa structure having spaced apart top and bottom surfaces interconnected by four side walls meeting at corner walls, each of said corner walls including a point at said mesa top surface where a <110> direction is tangential to the corner, and each of said corner walls including, starting from said point, a triangular facet, and the slopes of said side walls and said triangular facet, with respect to said mesa structure bottom surface, being around 45 and 54 degrees, respectively.

* * * * *